United States Patent [19]

Cheng et al.

[11] 4,398,001
[45] Aug. 9, 1983

[54] TERPOLYMER RESIST COMPOSITIONS

[75] Inventors: Ying Y. Cheng; Barbara D. Grant; Lester A. Pederson; Carlton G. Willson, all of San Jose, Calif.

[73] Assignee: International Business Machines Corporation, Armonk, N.Y.

[21] Appl. No.: 360,710

[22] Filed: Mar. 22, 1982

[51] Int. Cl.³ .......................... C08L 61/10; C08G 2/02
[52] U.S. Cl. ................................ 525/502; 204/159.14; 204/159.21; 204/159.22; 430/286
[58] Field of Search ................... 525/502; 204/159.21, 204/159.22, 159.14; 430/286

[56] References Cited

U.S. PATENT DOCUMENTS 3,684,770  8/1972  Hammer .................... 525/502
3,893,127  7/1975  Kaplan et al. .............. 346/1
3,898,350  8/1975  Gipstein et al. ............ 204/159.22

FOREIGN PATENT DOCUMENTS 5775  5/1979  European Pat. Off. .

Primary Examiner—Theodore E. Pertilla
Attorney, Agent, or Firm—Joseph G. Walsh

[57] ABSTRACT

A resist sensitive to electron beam (and X-ray) radiation but resistant to reactive ion etching is formulated from a novolac resin and a sensitizer which is a terpolymer of sulfur dioxide, an olefin is hydrocarbon and an unsaturated ether.

11 Claims, No Drawings

TERPOLYMER RESIST COMPOSITIONS

DESCRIPTION

1. Technical Field

The present invention is concerned with mixtures of novolac resins and certain terpolymers which are useful in resist compositions. In particular, it is concerned with mixtures useful because they are extremely sensitive to electron beam and X-ray radiation yet, are resistant to plasma and reactive ion etching. These mixtures are further useful because of their insensitivity to process variation i.e. they have wide process latitude.

2. Background Art

U.S. Pat. No. 3,893,127 shows the use of copolymers of hydrocarbon olefins and sulfur dioxide as resists for electron beam radiation. European patent application No. 0005775 shows the use of certain sulfur dioxide and olefin hydrocarbon copolymers as sensitizers for certain substituted, low molecular weight novolac resins to be exposed to radiation.

U.S. Pat. No. 3,898,350 shows a terpolymer of sulfur dioxide, an olefin hydrocarbon and an ester. The terpolymer is useful as an electron beam resist but lacks reactive ion etch resistance.

None of the prior art of which we are aware, however, shows the particular unsaturated ether-containing terpolymers of the present invention or teaches their advantages as sensitizers for novolac resins.

DISCLOSURE OF THE INVENTION

According to the present invention, resist compositions simultaneously combining sensitivity to electron beam (or X-ray radiation) with resistance to reactive ion etching are made by combining a novolac resin with a sensitizer which is a terpolymer of sulfur dioxide, an olefinic hydrocarbon and an unsaturated ether.

Polyolefin sulfones are well known to be sensitive to electron beam and X-ray radiation, but they can be cast only as thin films (approximately 0.5 microns) without cracking and their lithographic applications tend to be limited to mask making because they do not provide useful barriers to plasma and reactive ion etching. Novolac resins are excellent masking materials for chemical and reactive ion etching. The novolac resins, however, are extremely insensitive to electron beam and X-ray exposure. We have found that simple mixing of any polyolefin sulfone with any novolac resin does not provide a useful system because the polymers are not mutually soluble (compatible) and phase separation occurs even at very high novolac:sulfone ratios. Incompatibility is common in polymer blends whereas compatibility is an unpredictable and uncommon characteristic.

The consequence of phase separation, even on the most microscopic scale, is to reduce the resolution and lithographic performance of polysulfone/novolac mixtures to such an extent that they are not useful in semiconductor manufacturing or mask fabrication.

The present invention allows incorporation of high weight percent loadings of the radiation sensitive sulfone terpolymers into any novolac. This surprising characteristic is the result of incorporating the unsaturated ether monomer into the polysulfone. in the absence of the ether monomer, phase compatibility is not achieved. The ability to work with high sulfone loadings provides high sensitivity while the ability to work with high molecular weight novolacs provides excellent process latitude.

We find that copolymers of sulfur dioxide and unsaturated ether monomers such as 2-ethoxyethyl methallyl ether form compatible mixtures with all novolacs tested. However, the lithographic resolution of the polyethersulfone/novolac mixtures is not acceptable due to the low melting temperature of the mixtures.

Copolymers of olefinic hydrocarbons and sulfur dioxide such as polybutene-1-sulfone and poly 2-methyl-1-pentene sulfone do not, in general, form compatible mixtures with novolacs. In fact, they are compatible only with certain very unusual novolac structures that are available only in low molecular weights (3000).

In the case of the compatible mixtures, the resolution is acceptable, the melting point is acceptable, but process latitude is not acceptable. That is, the systems are not of practical use apparently because of the low molecular weight of the novolac.

When both the unsaturated ether and olefinic hydrocarbon monomers are polymerized with sulfur dioxide, the resulting terpolymers are compatible with all novolacs tested. The resulting mixtures provide resist formulations with excellent resolution, very high sensitivity and, since high molecular weight novolacs can be used, the process latitude is very wide. The surprising and powerful influence of the ether monomer on compatibility with novolacs allows a wide range of copolymer ratios to be used and very high loadings achieved.

The terpolymers used in the present invention appear to be 1:1 with respect to olefin and $SO_2$ and are, we believe, alternating. The olefin monomer ratio of hydrocarbon to ether may range from 4:1 to 1:4 where the preferred range is 2:1 to 1:2. The invention is relatively insensitive to structure variations, and to the molecular weight of the sensitizer. The preferred compositions have intrinsic viscosity in $CHCl_3$ of 0.1 to 1.5 where the most preferred range is 0.3 to 1.0.

The preferred olefinic hydrocarbon monomers are 1,1-dialkylethylene compounds such as 2-methyl-1-pentene but the invention is not limited to these materials, it is operative with a wide range of olefinic hydrocarbons and cycloolefinic hydrocarbons.

The preferred unsaturated ether monomers are 1-alkyl-1-alkoxyalkylethylenes such as 2-ethoxyethyl methallyl ether but the invention is not limited to these materials and is operative with a wide range of olefinic ether structures.

The term novolac, of course, is one well known in the chemical art. It refers to polymers made by condensing a phenol (which may be substituted or unsubstituted) with an aldehyde. A typical novolac is one formed from phenol and formaldehyde. Novolacs from cresylic acid and formaldehyde with mw 5,000 are especially useful.

EXAMPLE 1

The following synthetic procedures describe the preferred method for making the preferred terpolymer sensitizer and precursor ether.

A. Preparation of 2-ethoxyethyl methallyl ether

Into a 22 liter flask equipped with a reflux condenser, mechanical stirrer, addition funnel and nitrogen gas inlet, was placed 12.5 liters of dry tetrahydrofuran and 1958 grams of a 60% oil dispersion of sodium hydride. The mixture was stirred and heated to a gentle reflux, then 2.99 Kg of 3-chloro-2-methyl propene was added as one portion. Next, 2.79 Kg of 2-ethoxyethanol was added dropwise during 3.5 hours with no external heating of the resulting exothermic reaction. Refluxing was continued for two additional hours, then the solution was cooled to room temperature. Excess sodium hydride was decomposed by carefully adding ethanol then enough water to dissolve the resulting salts. The organic layer was separated and distilled through a vigreaux column at 156°–158° C. The yield of product was 3490 grams and was 99.4% pure by G.L.P.C. analysis.

B. Preparation of poly(2-methyl-1-pentene-co-SO2-co-2-ethoxyethyl methallyl ether)

A one-liter jacketed resin kettle fitted with a mechanical stirrer, nitrogen inlet, sulfur dioxide inlet, rubber septum, cooling bath sensor and iron constantan thermocouple was flushed with nitrogen and cooled to −60° C. Liquid sulfur dioxide (400 ml, 9.0 moles) was condensed into the flask and brought to −60° C. A mixture of 2-methyl-1-pentane (25.7 ml, 0.208 moles) and ethyleneglycol methallyl ethyl ether (35 ml, 0.21 moles) was added and the system was cooled to −60° C. As soon as the system attained thermal equilibrium, 1.4 ml of 0.46 M t-butylhydroperoxide in dioxane was added in a single portion. The resulting mixture was stirred for 1 hour at −60° C. and the reaction terminated by pouring the mixture into hexane to obtain a white precipitate. The reaction vessel was rinsed with a small portion of dichloromethane, and the washings were added to the hexane. Additional hexane was added to the polymer/hexane system, decanted, and the polymer mass was washed again with fresh hexane. The hexane was decanted again and the polymer was pressed to remove residual solvent.

The crude polymer was dissolved in dichloromethane and this solution was added dropwise to excess hexane. The white, fluffy product was collected by gravity filtration, rewashed with hexane then dried at 40° C. in vacuum for 24 to 48 hours to provide an isolated yield of 65 grams.

C. Preparation of resist solution

The preferred resist solution is prepared by dissolving 14 grams of novolac with 2 grams of terpolymer sensitizer in a solution of 85% by volume cellosolve acetate, 10% by volume n-butyl acetate, and 10% by volume mixed xylenes.

The solution is filtered through a celite bed then through a 0.2 micrometer teflon filter. A one micrometer thick resist layer is formed from the solution by spin coating at 4000 r.p.m. onto a silicon wafer. The coated film is baked at 100° C. for 30 minutes. Exposure to a scanning electron beam with an incident dose of 5 microcoulombs per $cm^2$ at 20 k.e.v. is followed by development in 0.28 N basic aqueous developer for 1 to 2 minutes. The resulting resolution is better than 1.0 micrometers.

D. Processing of the Resist

E-beam exposure at doses of 10, 5 and 2 microcoulombs/$cm^2$ yields overall development rates of 2200 A°/sec, 1000 A°/sec and 380 A°/sec respectively in 0.28 N aqueous base while the unexposed region shows a dissolution rate less than 10 A°/sec. The sensitivity at 2 microcoulombs/$cm^2$ as defined by the ratio of unexposed development rate (Ro) to exposed development rate (R), of the resist is greater than 30. This represents at least a 5 to 10 times improvement in sensitivity over commercially available novolac based resists and at least a 5 times improvement in sensitivity over any novolac based resist of which we are aware. Furthermore, the resist has excellent process latitude. The image quality changes very little with changes in formulation and processing variables.

Experiments were conducted to establish the plasma etching stability of the resist formulations as follows. Films of the preferred formulation and of pure novolac were spin-coated on silicon wafers and subjected to carbontetrafluoride ($CF_4$)/Oxygen ($O_2$) plasma etching conditions commonly used in semiconductor processing. The etch rates of the samples were compared and found to be identical within experimental error. Introduction of the sensitizer polymer does not effect the etch rate of the novolac. The etch rate of the sensitizer alone under the same conditions is at least 10 times faster than novolac of the resist formulated from sensitizer and novolac.

We claim:

1. A resist composition comprising a novolac resin and a sensitizer characterized in that said sensitizer is a terpolymer of sulfur dioxide, an olefin hydrocarbon and an unsaturated ether, said terpolymer containing olefin monomer and sulfur dioxide in a ratio of 1 to 1, with the olefin monomer comprising hydrocarbon and ether in a ratio between 4:1 and 1:4.

2. A resist composition as described in claim 1 wherein the olefinic hydrocarbon monomer is a 1,1-dialkylethylene.

3. A resist composition as described in claim 1 wherein the olefinic hydrocarbon monomer is 2-methyl-1-pentene.

4. A resist composition as described in claim 1 wherein the novolac is a cresylic acid novolac.

5. A resist composition as described in claim 4 wherein the cresylic acid novolac has mw greater than 5000.

6. A resist composition as described in claim 1 wherein the ether monomer is a 1-alkyl,1-alkoxyalkyl ethylene.

7. A resist composition as described in claim 1 wherein the ether is a methallyl alkyl ether.

8. A resist composition as described in claim 1 wherein the ether is 2-ethoxyethyl methallyl ether.

9. A resist composition as described in claim 1 wherein the terpolymer is formed from $SO_2$, 2-methyl-1-pentene and 2-ethoxyethyl methallyl ether.

10. A resist composition as described in claim 9 wherein the hydrocarbon:ether monomer ratio is from 1:2 to 2:1.

11. A resist composition as described in claim 9 wherein the intrinsic viscosity of the terpolymer in $CHCl_3$ is 0.3 to 1.0.

* * * * *